(12) United States Patent
Ikegami et al.

(10) Patent No.: US 6,794,762 B2
(45) Date of Patent: Sep. 21, 2004

(54) ELECTRONIC COMPONENT AND FABRICATION METHOD THEREOF

(75) Inventors: Gorou Ikegami, Ohtsu (JP); Tomonobu Sugimoto, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/368,461

(22) Filed: Feb. 20, 2003

(65) Prior Publication Data

US 2003/0160339 A1 Aug. 28, 2003

(30) Foreign Application Priority Data

Feb. 27, 2002 (JP) ........................................ 2002-050903

(51) Int. Cl.[7] .............................................. H01L 23/28
(52) U.S. Cl. ........................ 257/787; 257/666; 438/123; 438/124
(58) Field of Search ................................ 257/668, 787, 257/666, 784; 438/112, 119, 121, 123, 127, 124

(56) References Cited

U.S. PATENT DOCUMENTS

| | | | |
|---|---|---|---|
| 5,200,362 A | * | 4/1993 | Lin et al. |
| 5,273,938 A | * | 12/1993 | Lin et al. |
| 5,977,613 A | * | 11/1999 | Takata et al. |
| 6,259,022 B1 | * | 7/2001 | Steffen |
| 6,437,430 B2 | * | 8/2002 | Yamada |
| 6,580,161 B2 | * | 6/2003 | Kobayakawa |

FOREIGN PATENT DOCUMENTS

| | | |
|---|---|---|
| JP | 62-122349 | 8/1987 |
| JP | 10-98133 | 4/1998 |
| JP | 2002-16181 | 1/2002 |

* cited by examiner

Primary Examiner—S. V. Clark
(74) Attorney, Agent, or Firm—Young & Thompson

(57) ABSTRACT

An electronic component, in which an electronic element 9 fixed onto a first electrically conductive film 7 is electrically connected to second electrically conductive films 8 arranged in substantially the same plane as that of the first electrically conductive film 7 and the electronic element 9 including peripheries of the first and second electrically conductive films 7 and 8 is covered by an encapsulation resin portion 11, has electrically conductive protrusions 13 formed on an exposed surface of the first and second electrically conductive films exposed from the encapsulation resin portion 11.

13 Claims, 6 Drawing Sheets

FIG. 3
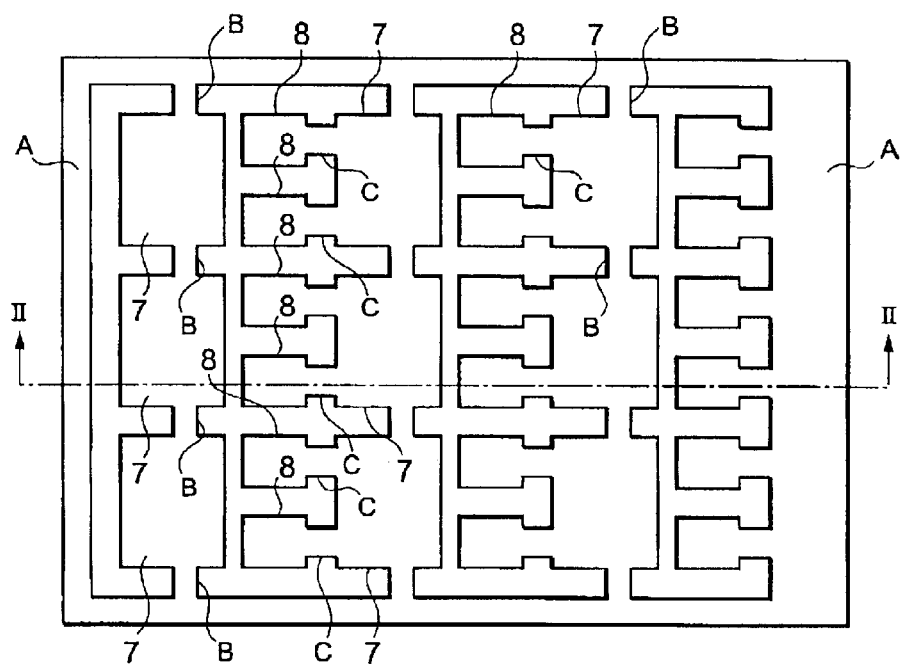
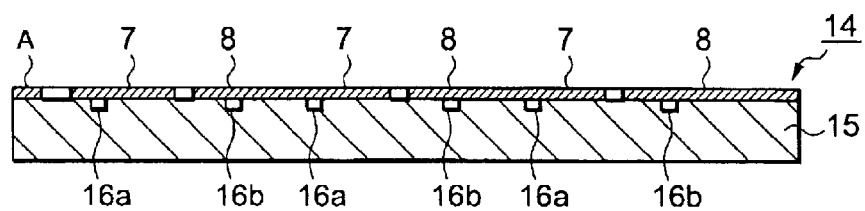
FIG. 4

ELECTRONIC COMPONENT AND FABRICATION METHOD THEREOF

BACKGROUND OF THE INVENTION

1. Field of the Invention

The present invention relates to a surface mounting type electronic component and a fabrication method thereof and, more particularly, to a structure of a resin molded electronic component with which electronic components each having outer diameter not larger than 1 mm are easily realized and a fabrication method of electronic components having the same structure.

2. Description of the Prior Art

A surface mounting type resin molded electronic component is usually fabricated by using a lead frame. That is, the lead frame having integrally formed island portions and lead portions is prepared, a semiconductor chip such as IC or LSI is mounted on each island portion and then electrodes of the semiconductor chip are electrically connected to the lead portions by bonding wires. Thereafter, main portions of the lead frame including the semiconductor chips thereon are sealed by encapsulation resin and unnecessary portions of the lead frame, which are exposed from the encapsulation resin, are cut away. An example of such electronic component is disclosed in JUS62-122349A. The example is shown in FIG. 1. In FIG. 1, a semiconductor chip 3 is mounted on each island portion 1 of a lead frame. Electrode pads (not shown) of the semiconductor chip 3 are electrically connected to leads 2 by bonding wires 4. An electronic component 6 includes the semiconductor chip 3 and the lead portions 2 coated with an encapsulation resin 5. The electronic component 6 can be mounted on an upper surface of a support member (not shown) since the island portion 1 and the lead portions 2 are exposed in a plane coplanar with a lower surface of the encapsulation resin portion 5, so that it contributes to the downsizing of electronic circuit device. In this structure of the electronic component 6, there may be a case where, in the resin molding stage, the encapsulation resin portion 5 in molten state enters into a mounting surface of the island portion 1 and the lead portions 2, resulting in a thin resin flash on the mounting surface side. In such case, the thin resin flash on the mounting surface side of the electronic component 6 becomes an obstacle when the surface mounting of the electronic component is performed. In order to remove the thin resin flash, a flexible resin film (not shown) is adhered to the lead frame and, after the resin capsulation is performed, the resin film is peeled off from the lead frame to prevent the resin flash from being formed on the mounting surfaces of the island portion and the lead portions.

On the other hand, further reduction of size and weight of a small electronic circuit device such as portable telephone set has been requested. In order to realize the further reduction of size and weight of the small electronic circuit device, further reduction of size and weight of an electronic component is necessary. In order to deal with such request of reduction of size and weight of the electronic component, it is necessary to downsize the semiconductor chip 3 itself and simultaneously to downsize the lead frame to thereby reduce outer size of the island portion 1, width of the lead portion 2 and a distance between adjacent lead portions 2. However, when the lead frame is made thinner, the mechanical strength thereof is lowered and the lead frame tends to be deformed by vibration and/or shock during transportation thereof. Therefore, there is a limit in downsizing an electronic component using a lead frame.

In view of this, JPH10-98133A discloses an electronic component having a structure in which electrodes connected to a semiconductor chip for connecting the latter to external terminals are directly exposed in an outer surface of an encapsulation resin portion covering the semiconductor chip. In this electronic component, the semiconductor chip and the electrodes for connection to external terminals are arranged on a supporting substrate and electrode pads of the semiconductor chip are electrically connected to the electrodes by bonding wires. Thereafter, an upper surface side of the supporting substrate is covered by the encapsulation resin portion and a rear surface of the semiconductor chip and the electrodes are exposed in a lower surface of the encapsulation resin portion by peeling off the supporting substrate from the hardened encapsulation resin portion.

Further, JP2002-16181A discloses another electronic component in which first metal layers and second metal layers are formed on a surface of a flexible metal substrate, semiconductor chips are mounted on the first metal layers and electrode pads of the semiconductor chips are electrically connected to the second metal layers by bonding wires. Thereafter, the metal substrate is covered by encapsulation resin and the first and second metal layers are exposed by peeling off the metal substrate from the encapsulation resin portion. Thereafter, individual electronic components are obtained by cutting the encapsulation resin portion suitably.

The electronic component disclosed in JPH10-98133A or JP2002-16181A does not require a lead frame, so that further downsizing of the electronic component is possible compared with the electronic component disclosed in JUS62-122349A.

Such surface mounting type electronic component is usually mounted by painting electrically conductive land portions on a printed circuit board with solder paste and electronic components are temporarily mounted thereon. And then, the printed circuit board is put in high temperature environment to melt the solder paste to thereby solder the electronic components to the conductive land portions. In this soldering step, the electronic components become in a floating state on melted solder. Therefore, if an amount of solder is excessive, the electronic components may be moved laterally before the solder is solidified, resulting in positional deviation of the electronic components. On the other hand, if the amount of solder is short, stress due to difference in thermal expansion coefficient in soldering interface is repeatedly applied to the interface by repetitive thermal expansion and thermal shrinkage thereof, resulting in that the soldering interface is cracked and, when the crack grows, the electrical connection may be lost. Therefore, it is necessary to regulate the amount of solder paste appropriately and to supply the electronic components onto the solder in such a manner that configuration of solder in melted state is not varied.

Since flat electrodes such as rear side electrodes and electrode pads of the electronic component disclosed in JPH10-98133A or JP2002-16181A or the first and second metal layers disclosed in JP2002-16181A are close to each other and exposed in the same plane as the surface of the encapsulation resin portion, there may be a short-circuit between flat electrodes by melted solder or, even if there is no short-circuit, the electrical connection may become degraded.

SUMMARY OF THE INVENTION

An object of the present invention is to provide an electronic component comprising an electronic element fixed onto a first electrically conductive film electrically connected to at least one second electrically conductive film provided in substantially the same plane as that of the first conductive film, an encapsulation resin portion covering the fixing surface of the electronic element including peripheral portions of the first and second conductive films and electrically conductive protrusions formed in portions of the first and second conductive films, which are exposed in a lower surface of the encapsulation resin portion.

Another object of the present invention is to provide a fabrication method for fabricating electronic components, comprising the steps of forming fine holes in predetermined positions in one of major surfaces of a resin film, forming first electrically conductive films and second electrically conductive films in a plurality of regions including the predetermined positions of the resin film in which the fine holes are formed, fixing electronic elements onto the first electrically conductive films, respectively, electrically connecting electrodes on the electronic elements to the second electrically conductive films, respectively, covering regions including the electronic elements on the resin film by an encapsulation resin portion, externally exposing the first and second electrically conductive films having electrically conductive protrusions by peeling off the resin film while the first and second electrically conductive films are left in the encapsulation resin portion and separating the electronic elements to individual electronic components by cutting the encapsulation resin portion.

The electronic component according to the present invention has a structure similar to that disclosed in JP2002-16181A. However, the electronic component of the present invention differs from that disclosed in JP2002-16181 A in that the electrically conductive protrusions are formed on the portions of the electrically conductive films, which are exposed externally of the encapsulation resin portion. The electrically conductive protrusions of the electronic component may be formed as island portions on the exposed surfaces of the electrically conductive films. In such case, the electrically conductive protrusions may be formed by locally protruding outer side surfaces of the externally exposed electrically conductive films or by locally pushing out the electrically conductive films from the encapsulation resin portion. The electrically conductive protrusions may be dispersed on the electrically conductive films. Alternatively, the protrusions may take the form of line segments or rings.

The electronic component according to the present invention can be fabricated through the steps of forming fine holes in predetermined positions on one of major surfaces of a resin film, forming a first electrically conductive film and at least one second electrically conductive film in each of a plurality of regions including the predetermined positions of the resin film in which the fine holes are formed, fixing an electronic element onto each of the first electrically conductive film, electrically connecting electrodes on the electronic element to the second electrically conductive film, covering regions of the resin film including the electronic elements on the resin film by an encapsulation resin portion, externally exposing the first and second electrically conductive films-having electrically conductive protrusions by peeling off the resin film from the encapsulation resin portion while the first and second electrically conductive films are left in the encapsulation resin portion and separating the electronic elements to individual electronic components by cutting the encapsulation resin portion. In such case, the fine holes of the insulating film may be formed by laser light irradiation or etching or by pressing the resin film with using a tool having hard protrusions.

Alternatively, the electronic component according to the present invention may be fabricated through the steps of forming at least two electrically conductive films on one of major surfaces of a resin film, fixing an electronic element onto one of the electrically conductive films, electrically connecting electrodes on the electronic element to the other electrically conductive film, protruding the electrically conductive films formed on the resin film into the resin film by locally pressing the conductive films into the resin film, covering a region of the resin film including the electronic element on the resin film by an encapsulation resin portion, externally exposing the respective electrically conductive films by peeling off the resin film from the encapsulation resin portion while the electrically conductive films are left in the encapsulation resin portion and separating the electronic element to an electronic component by cutting the encapsulation resin portion. In such case, the conductive protrusions may be formed by pressing the conductive film by a hard member having a plurality of protrusions such that the conductive film is partially embossed in the resin film. Further, when the electronic element is connected to the electrically conductive film by bonding wires, the conductive protrusions may be formed by partially pressing one ends of the wires on the conductive film.

BRIEF DESCRIPTION OF THE DRAWINGS

FIG. 3 is a plan view of a wiring substrate used in fabricating the electronic component of the present invention;

FIG. 4 is a cross section taken along a line II—II in FIG. 3;

DETAILED DESCRIPTION OF THE PREFERRED EMBODIMENTS

Figure 1:
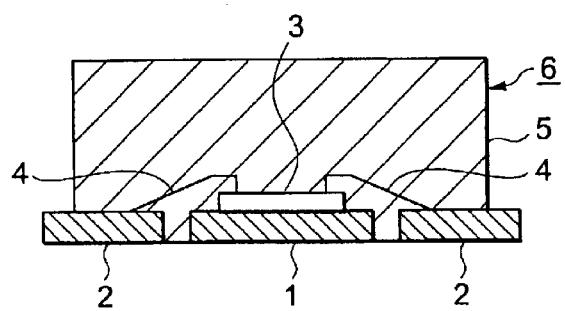
FIG. 1 is a cross sectional view of a conventional electronic component.
Figure 2A:
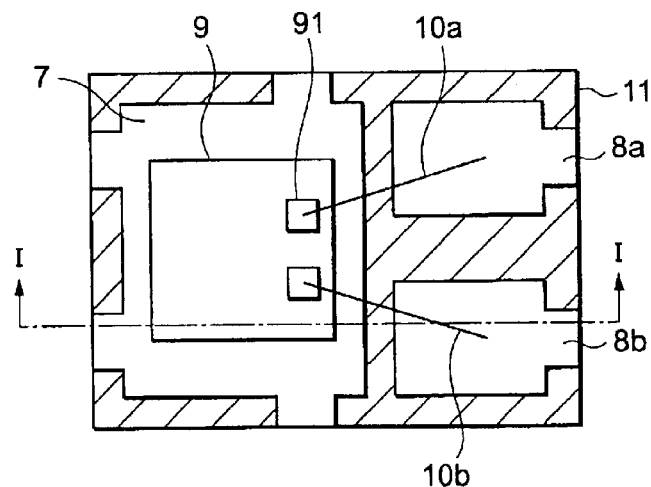
FIG. 2A is a partially cutaway plan view of an electronic component according to an embodiment of the present invention.
Figure 2B:
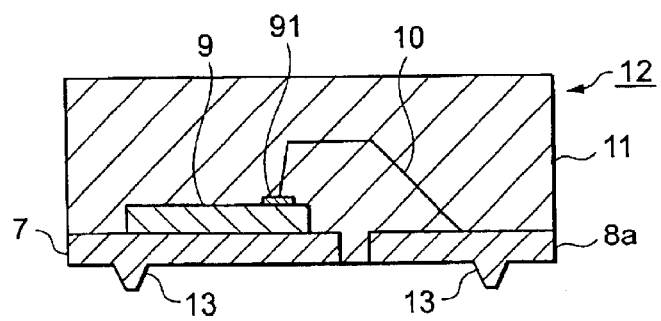
FIG. 2B is a cross section taken along a line I—I in FIG. 2A.

Referring to FIG. 2A and FIG. 2B, the electronic component 12 includes a first electrically conductive film 7 on which a semiconductor chip 9 such as an IC or a LSI is mounted as an electronic element and second electrically conductive films 8a and 8b arranged in the same plane as that of the first conductive film 7. In the following description, the semiconductor chip 9 will be described as a typical example of a resin sealed electronic element. In the shown example, the second conductive films 8a and 8b having identical size and identical configuration are arranged on one side of the first conductive film 7. The first conductive film 7 and the second conductive films 8a and 8b are formed by a single electrically conductive layer or a multiple electrically conductive layer formed of a metal material such as gold, copper or nickel or an alloy containing the metal material as a main constituent by plating and are 0.5 to 50 µm thick, respectively. Electrode pads 91 on the semiconductor chip 9 are electrically connected to the second conductive films 8a and 8b by bonding wires 10a and 10b, respectively. An area of the electronic component 12 on which the semiconductor chip 9 is fixed to and peripheral area of the first conductive film 7 and the second conductive films 8a and 8b are sealed by an encapsulation resin portion 11. An area of the encapsulation resin portion 11 is, for example, 0.8 mm×0.6 mm. For this area size of the encapsulation resin portion 11, an area of the first conductive film 7 is, for example, 0.4 mm×0.4 mm and an area of each of the second conductive films 8a and 8b is, for example, 0.2 mm×0.2 mm.

The electronic component 12 according to the present invention is featured by that the first and second conductive films 7, 8a and 8b, which are exposed in one of major surfaces of the encapsulation resin portion 11, that is, a rear surface thereof, are formed with fine electrically conductive protrusions 13a and 13b thereon. Each of the fine conductive protrusions 13a and 13b has a root portion having diameter of 40 to 100 µm and is 20 to 100 µm high. In the shown example, two of the protrusions are formed in the first conductive film 7 and one of them is formed in each of the second conductive films.

A fabrication method of the electronic component 12 will be described with reference to FIG. 3 to FIG. 9. A wiring substrate 14 having a plan view shown in FIG. 3 and a cross sectional view taken along a line II—II in FIG. 4 is prepared first. The wiring substrate 14 includes a flexible insulating substrate 15 having a plurality of fine holes 16a and 16b formed at predetermined intervals in predetermined positions of a surface thereof. A whole surface of the insulating substrate 15 including the fine holes 16a and 16b is covered by an electrically conductive thin film (not shown) and first electrically conductive films 7 and second electrically conductive films 8 are formed in regions of the insulating substrate including the fine holes 16a and 16b by etching the electrically conductive thin film. Surface roughness of the insulating substrate 15 is 0.1 to 5 µm depending on a material thereof so that bonding strength between the conductive films 7 and 8 and the insulating substrate becomes not too high. Each of the fine holes 16a and 16b has a circular or conical shape 20 to 100 µm deep and a root portion thereof has diameter of 40 to 100 µm. The fine holes may be formed by irradiating the insulating substrate with laser light, locally etching the insulating substrate or pressing the insulating substrate by a flat plate having hard protrusions arranged in predetermined positions thereof. The electrically conductive thin film may be an electroless plated single layer film, a multi-layer film including an electroless plated layer and an electroless or electrolytic plated layer formed on the electroless plated layer, or an electrically conductive foil adhered to the insulating substrate 15.

Since the first conductive films 7 and the second conductive films 8 are simultaneously formed by electroplating, the conductive films 7 and 8 are electrically connected to each other. That is, as shown in FIG. 3, the insulating substrate 15 is surrounded by an electrically conductive rectangular frame A. The vertically arranged first conductive films 7 are electrically connected to each other through electrically conductive pieces B and uppermost first conductive films and lowermost first conductive films are connected to the rectangular frame A by conductive pieces B. The second conductive films 8 are electrically connected to the first conductive film 7 adjacent thereto through connecting pieces C. The fine holes 16a are filled with the material of the conductive film 7 and the fine holes 16b are filled with the material of the conductive film 8, so that the electrically conductive protrusions are integrally formed on the respective conductive films 7 and 8. Bonding strength (peeling strength) of the conductive films 7 and 8 with respect to the insulating substrate 15 is set to a value smaller than 500 g/cm, for example, 200 g/cm, which is unsuitable for a usual printed wiring substrate for electronic circuit device, by roughing the surface of the insulating substrate 15.

Figure 5:
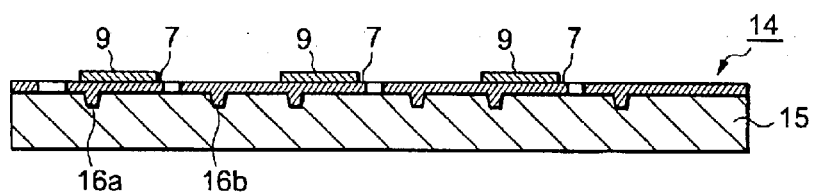
FIG. 5 is a cross sectional view showing the wiring substrate in the mounting step of the electronic component of the present invention.

Next, the semiconductor chip 9 is mounted on each of the first conductive films 7 as shown in FIG. 5. The mounting of the semiconductor chips is usually performed by using electrically conductive adhesive such as silver paste. In a case where the insulating substrate 15 is formed of a heat durable material, it may be possible to mount the semiconductor chips by thermo compression bonding or ultrasonic bonding.

Figure 6:
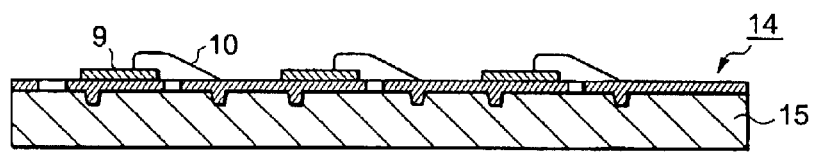
FIG. 6 is a cross sectional view showing the wiring substrate in the wire bonding step according to the present invention.
Figure 7:
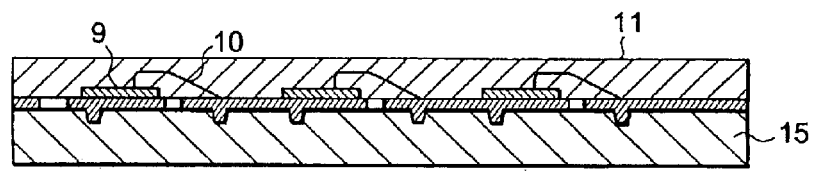
FIG. 7 is a cross sectional view showing the wiring substrate in the resin molding step according to the present invention.

Thereafter, as shown in FIG. 6, electrodes (not shown) of the semiconductor chips 9 are electrically connected to the second conductive films 8 by bonding wires 10. After the wire bonding work is completed, the wiring substrate 14 is transported to a resin molding step and the upper portion of the insulating substrate 15 is molded by the encapsulation resin portion 11 as shown in FIG. 7. Thus, the conductive films 7 and 8 are molded in the encapsulation resin portion with peripheral surfaces of the conductive films 7 and 8 being in contact with the encapsulation resin portion 11.

Figure 8:
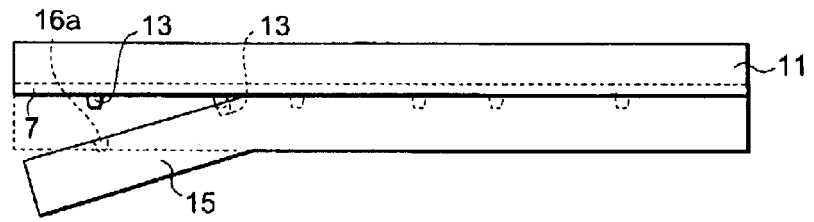
FIG. 8 is a cross sectional view showing the peeling step of peeling off an insulating substrate from the wiring substrate according to the present invention.

After the resin molding step is completed, the wiring substrate 14 is transported to a peeling step for peeling off the insulating substrate 15 from the conductive films, as shown in FIG. 8. In peeling the insulating substrate from the conductive films, it is possible to facilitate the peeling work without deformation of the encapsulation resin portion 11 by adhering a fixed plate (not shown) to the side of the encapsulation resin portion 11 on demand. Since the bonding strength between the conductive films 7 and 8 and the insulating substrate 15 is preliminarily set to the small value, the conductive films 7 and 8 are left on the side of the encapsulation resin portion 11 and exposed externally when the insulating substrate 15 is peeled off.

Figure 9:
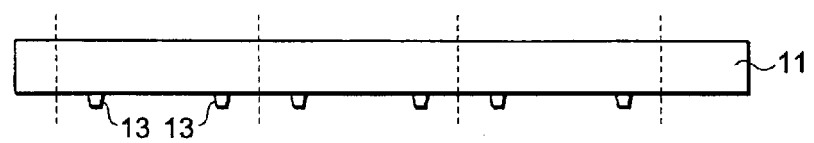
FIG. 9 is a cross sectional view showing the step of separating individual electronic components by dicing an encapsulation resin portion, according to the present invention.
Figure 10:
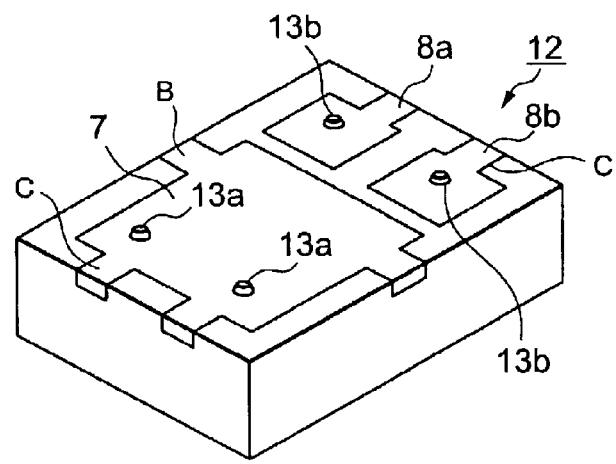
FIG. 10 is a perspective view of an electronic component, showing a surface thereof on which the electrically conductive film of the electronic component according to the present invention.

After the insulating substrate 15 is peeled off in this manner, the encapsulation resin portion 11 is cut by a dicer (not shown) using a rotary blade or water jet along dotted lines as shown in FIG. 9. Thus, unnecessary portions of the conductive films formed on the insulating substrate 15 such as the rectangular frame A are removed. That is, by cutting the encapsulation resin portion 11 along center lines between the connecting pieces B and C, the first conductive films 7 are separated from the second conductive films 8, resulting in the electronic components shown in FIG. 2A, FIG. 2B and FIG. 10.

The conductive protrusions 13 of the electronic component 12 are formed of the electrically conductive material filling the fine holes 16a and 16b formed in the insulating substrate 15 as mentioned previously. The conductive protrusions 13a and 13b each having a root portion having diameter of 40 to 100 µm and height of 20 to 100 µm function as spacers in surface-mounting the electronic component on an external printed wiring substrate through electrically conductive adhesive. Therefore, it is possible to have the conductive adhesive layer having an enough thickness below the conductive films 7 and 8 even if the electronic component 12 is pressed down to the mounting substrate, so that reliable mounting can be realized.

Figure 11:
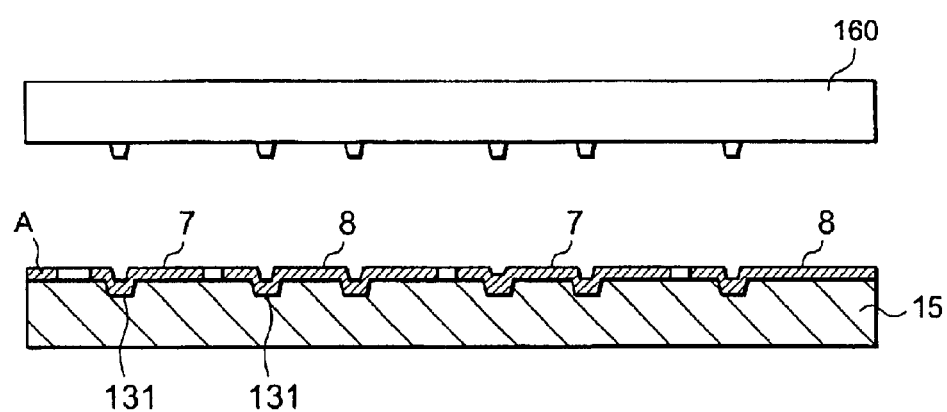
FIG. 11 illustrates another example of the formation of electrically conductive protrusions according to the present invention.

In the described embodiment, the conductive protrusions 13 are formed by using the insulating substrate 15 having the fine holes 16 preliminarily formed therein. However, the conductive protrusions may be formed by a method shown in FIG. 11. As shown in FIG. 11, after the conductive films 7 and 8 are formed on the insulating substrate 15, the conductive films 7 and 8 are locally pushed into the insulating substrate 15 by pressing the conductive films into the insulating film by a flat surface of a pressurizing member 160, which is formed with a number of fine protrusions 161. After the insulating substrate 15 is peeled off, the pressed portions of the conductive films 7 and 8 become electrically conductive protrusions 131.

Alternatively, when the semiconductor chip 9 on the first conductive film 7 is connected to the second conductive films 8 by bonding wires 10, the conductive protrusions may be formed by locally pressing the second conductive films 8 into the insulating substrate 15 by means of a bonding tool having a sharp end in electrically connecting the semiconductor chip 9 to the second conductive films by the bonding wires 10 such that a portion of the bonding tool protrudes into the insulating substrate 15. That is, portions of the conductive films, which are pressed by the sharp end of the bonding tool, become the conductive protrusions. In such case, a special wiring substrate and special pressing member becomes unnecessary.

Figure 12:
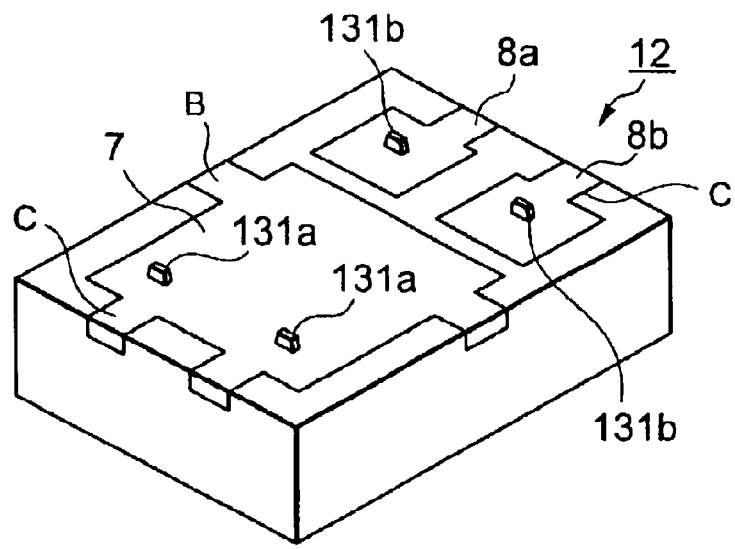
FIG. 12 is a perspective view of another example of the electronic component according to the present invention.
Figure 13:
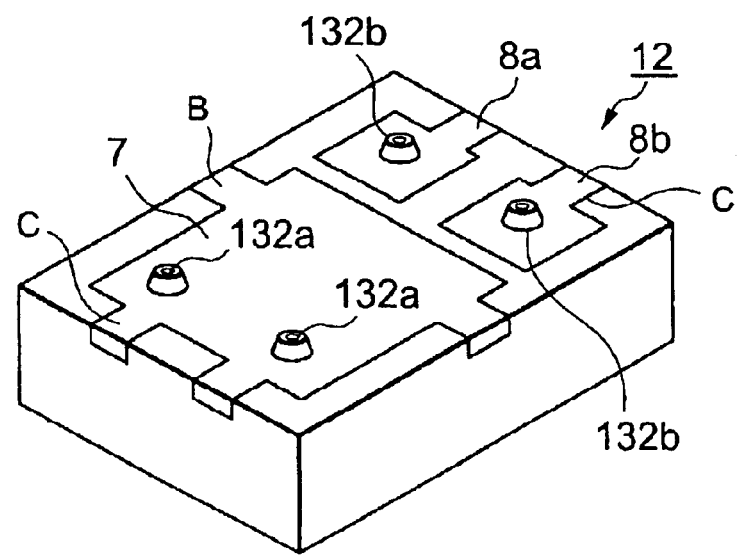
FIG. 13 is a perspective view of another example of the electronic component according to the present invention.
Figure 14:
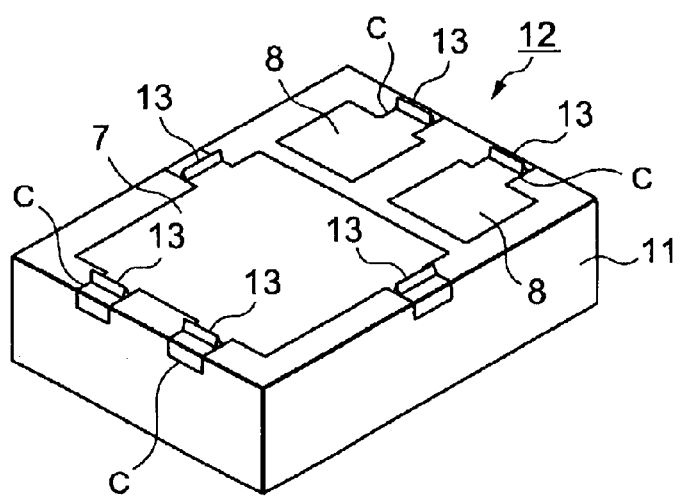
FIG. 14 is a perspective view of another example of the electronic component according to the present invention.

In the electronic component mentioned above, the conductive protrusions 13 having island shapes are arranged on the conductive films 7 and 8. However, the shape of the conductive protrusion is not limited to the island. For example, the conductive protrusion may have a line segment shape as shown in FIG. 12 or an annular shape as shown in FIG. 13. It is possible to easily form continuous conductive protrusions by forming continuous grooves in the insulating substrate, for example, irradiating the insulating substrate 15 with laser light, scratching it by a scriber or etching it along straight lines and then forming conductive films on the grooves. Further, it is possible to form the conductive protrusions 13 in the vicinities of the first and second conductive films 7 and 8 as shown in FIG. 14 by forming continuous grooves extending along center lines of the connecting pieces B and C connecting between the first and second conductive films 7 and 8. Thus, it is possible to surround the respective conductive films 7 and 8 by the conductive protrusions 13.

It should be noted that the present invention is not limited to the embodiments described previously and the present invention can be applied to not only the electronic element having outer size not larger than 1 mm but also the electronic component having outer size larger than 1 mm. The connecting means for electrically connecting the semiconductor chip 9 to the conductive film 8 is not limited to the bonding wire. It is possible to use a conductive tape instead of the bonding wire. Further, by forming protruded electrodes on the rear surface of the semiconductor chip instead of the electrode pads on the upper surface thereof, it is possible to arrange the semiconductor chip 9 bestriding a boundary between the conductive film 7 and the conductive film 8 to thereby directly connect the semiconductor chip to the respective conductive films 7 and 8.

The number of the conductive films 7 and the number of the conductive films 8 of the electronic component are of course determined by the number of electrodes for connecting the semiconductor chip 9 externally.

It should be noted that the present invention is not limited to the described embodiments. The element to be encapsulated by resin is not only an active element such as semiconductor chip or semiconductor pellet but also a passive element such as resistor, capacitor or inductor.

As described hereinbefore, according to the present invention, it is possible to hold the electrically conductive adhesive having a predetermined thickness in a space defined by the electrically conductive lands and the electrically conductive films in mounting the electronic component even having outer size smaller than 1 mm on the printed wiring substrate to thereby restrict swelling out of the conductive adhesive and/or variation of shape of the conductive adhesive when the electronic component is supplied. Therefore, it becomes possible to prevent short-circuit due to inter-electrode bridge even when the first conductive films 7 and the second conductive films 8 are approximated to each other. Consequently, it is possible to realize a compact and easily mountable electronic component.

What is claimed is:

1. An electronic component comprising:

a first electrically conductive film having one surface mounting an electronic element and the other surface formed with first electrically conductive protrusions;

a second electrically conductive film provided in substantially the same plane as that of said first electrically conductive film, said second electrically conductive film having one surface electrically connected to electrodes of said electronic element and the other surface formed with second electrically conductive protrusions; and an encapsulation resin portion for covering said electronic element, said encapsulation resin portion being formed on said one surface of said first electrically conductive film and said one surface of said second electrically conductive film, the other surfaces of said first and second electrically conductive film being exposed out of said encapsulation resin portion.

2. An electronic component as claimed in claim 1, wherein said electrically conductive protrusions take in the form of islands, respectively.

3. An electronic component as claimed in claim 1, wherein said first and second electrically conductive protrusions take the form of at least one of line segment and annular protrusions.

4. A fabrication method of electronic component, comprising the steps of:

forming at least a group of first electrically conductive regions and a group of second electrically conductive regions on one of major surfaces of a resin film, said first and second electrically conductive regions having electrically conductive protrusions protruding on the side of said resin film, respectively;

fixing electronic elements onto the group of said first electrically conductive regions;

electrically connecting electrodes of said electronic elements to said group of said second electrically conductive regions;

covering said electronic elements on said resin film by an encapsulation resin portion;

exposing the group of said first electrically conductive regions having said electrically conductive protrusions and the group of said second electrically conductive regions having said electrically conductive protrusions in a surface of said encapsulation resin portion by peeling off said resin film from the groups of said first and second electrically conductive regions while said first and second electrically conductive regions being left in said encapsulation resin portion; and cutting said encapsulation resin portion such that individual electronic components are separated.

5. A fabrication method of electronic component, as claimed in claim 4, wherein said electrically conductive protrusions are formed by forming the group of said first electrically conductive regions and the group of said second electrically conductive regions such that fine holes preliminarily formed in predetermined positions of said one major surface of said resin film are filled with a material of said first and second electrically conductive regions.

6. A fabrication method of electronic component, as claimed in claim 4, wherein said electrically conductive protrusions are formed by, before the covering step, locally pressing said first and second electrically conductive films formed on said resin film such that the locally pressed portions of said electrically conductive films protrude into said resin film.

7. An electronic component comprising:

a perimeter defined by outer vertical edges of an encapsulation resin portion;

a base formed of a first electrically conductive film and a second electrically conductive film, the resin portion extending between the first and second electrically conductive films, outer vertical edges of the first and second electrically conductive films being in vertical registration with the outer vertical edges of the resin portion and exposed out of the resin portion so that the respective vertical edges form co-planar vertical sides of the electronic component;

an electronic element;

the first electrically conductive film having a front surface mounting the electronic element and a bottom surface formed with first electrically conductive protrusions, the first electrically conductive protrusions being exposed out of the resin portion; and the second electrically conductive film provided in substantially the same plane as that of said first electrically conductive film, said second electrically conductive film having a front surface electrically connected to electrodes of said electronic element and a bottom surface formed with second electrically conductive protrusions, the second electrically conductive protrusions being exposed out of the resin portion, the encapsulation resin portion covering said electronic element, said encapsulation resin portion being formed on the front surface of said first electrically conductive film and the front surface of said second electrically conductive film.

8. An electronic component as claimed in claim 7, wherein said first and second electrically conductive protrusions take the form of islands.

9. An electronic component as claimed in claim 7, wherein said first and second electrically conductive protrusions take the form of line segment protrusions.

10. An electronic component as claimed in claim 7, wherein said first and second electrically conductive protrusions take the form of annular protrusions.

11. An electronic component as claimed in claim 7, wherein the bottom surface of said first and second electrically conductive films is exposed out of said encapsulation resin portion.

12. An electronic component as claimed in claim 1, wherein, a perimeter of the encapsulation resin portion defines a complete perimeter of said electronic component, and vertical edge surfaces of said first and second electrically conductive films are exposed out of said encapsulation resin portion at the perimeter of said electronic component.

13. An electronic component as claimed in claim 12, wherein the vertical edge surfaces of said first and second electrically conductive film are vertically co-planar with vertical edge surfaces of the encapsulation resin portion.

* * * * *